(12) United States Patent
Kang

(10) Patent No.: US 7,002,857 B2
(45) Date of Patent: Feb. 21, 2006

(54) SEMICONDUCTOR DEVICE HAVING AUTOMATIC CONTROLLED DELAY CIRCUIT AND METHOD THEREFOR

(75) Inventor: Chang-Seok Kang, Kyoungki-do (KR)

(73) Assignee: Hynix Semiconductor, Inc., (KR)

( * ) Notice: Subject to any disclaimer, the term of this patent is extended or adjusted under 35 U.S.C. 154(b) by 11 days.

(21) Appl. No.: 10/879,339

(22) Filed: Jun. 28, 2004

(65) Prior Publication Data

US 2005/0117413 A1    Jun. 2, 2005

(30) Foreign Application Priority Data

Dec. 1, 2003 (KR) .................. 10-2003-0086251

(51) Int. Cl.
*G11C 7/00* (2006.01)
(52) U.S. Cl. ............. 365/194; 365/189.07; 365/189.09; 365/191
(58) Field of Classification Search ................ 365/194, 365/189.07, 189.09, 191
See application file for complete search history.

(56) References Cited

U.S. PATENT DOCUMENTS 6,269,051 B1 * 7/2001 Funaba et al. .............. 365/233

* cited by examiner

*Primary Examiner*—Anh Phung
*Assistant Examiner*—Pho M. Luu
(74) *Attorney, Agent, or Firm*—Blakely Sokoloff Taylor & Zafman

(57) ABSTRACT

An automatic controlled delay circuit for use in a semiconductor memory device capable of detecting and adjusting a variation in delay with PVT variation delays a wordline activating signal by a predetermined time period and outputs the same as a bitline sense amplifier activating signal. The delay circuit is implemented with a plurality of delay blocks that are connected serially. The semiconductor device comprises a delay pulse signal generating block for generating a plurality of delayed pulse signals, each of which has different delay values at a time point at which the wordline activating signal is activated using an internal clock; a signal detecting block for detecting an activation time point of the bitline sense amplifier activating signal to generate a detected pulse signal; and a delay amount adjusting block for comparing the plurality of delayed pulse signals with the detected pulse signal to control the plurality of delay blocks.

18 Claims, 7 Drawing Sheets

SEMICONDUCTOR DEVICE HAVING AUTOMATIC CONTROLLED DELAY CIRCUIT AND METHOD THEREFOR

FIELD OF INVENTION

The present invention relates to a semiconductor design technique; and, more particularly, to a semiconductor memory device with an automatic controlled delay circuit, and a method therefor.

DESCRIPTION OF PRIOR ART

In general, the number of clock cycles taken between the issuing of the active command and the read/write command is referred to as tRCD (RAS to CAS Delay) in a DRAM. The tRCD is a non-adjustable value so that it is a fixed value by physical characteristics of the semiconductor memory device. Thus, the tRCD is a factor that is critical in determining an operating frequency and a Bin Portion representing a ratio of chip with the operating frequency on a wafer.

Meanwhile, in terms of the tRCD internally, the tRCD is a time taken until a bitline pair is amplified to a level (60% of full VDD level) at which memory cell data can be sensed by the active command. A time, which is taken between the issuing of dual active commands and the activation of bitline sense amplifier activating signal, is the longest one. The reason for this is that it is needed until a logic level of the memory cell data applied to the bitline pair becomes a level sensible by the bitline sense amplifier. As a result, the tRCD is determined depending on how quick the bitline sense amplifier activating signal is activated, and therefore the operating frequency of the chip as well as the bin portion are affected.

A detailed description will be made as to a delay circuit, which receives a wordline activating signal activated by the active command as its input and activates the bitline sense amplifier activating signal after a predetermined time period.

FIG. 1 is a block diagram illustrating a circuit of generating a sense amplifier activating signal according to the prior art.

Referring to FIG. 1, the circuit is implemented with a delay block 10, which delays a wordline activating signal wl_act by a predetermined time period to output a bitline sense amplifier activating signal sa_act.

FIG. 2 is a waveform of the circuit shown in FIG. 1 and a diagram illustrating a variation in voltage of bitline and wordline with input signals.

First, when the wordline activating signal wl_act is activated by the issuing of the active command ACT, an wordline WL is activated. The activation of the wordline WL allows memory cell data to be flowed in a bitline pair BL and /BL as a fine voltage, and allows the bitline sense amplifier activating signal sa_act to be activated after a predetermined delay ($\alpha$-Delay), thereby detecting and amplifying a voltage in the bitline pair BL and /BL. Thereafter, the issuing of precharge command PCG allows the wordline activating signal wl_act to be inactivated, thereby inactivating the wordline WL and pre-charging the bitline pair BL and /BL.

Meandwhile, in case the abovementioned prior art is used, a time point that the bitline sense amplifier activating signal sa_act is activated, is delayed according to PVT (Process Voltage Temperature) variation. The reason for this is that the predetermined delay ($\alpha$-Delay), which is provided for the delay block (indicated by reference numerals 10 in FIG. 1) implemented with capacitors, resistances, inverters and the like, changes with the PVT variation.

Like the bitline sense amplifier activating signal sa_act, in case the time point of signals which are activated after the predetermined time period occupies a important portion in the overall operation, the operating frequency and the bin portion of the semiconductor device are affected by the activation time point of the activating signals.

SUMMARY OF INVENTION

It is, therefore, an object of the present invention to provide a semiconductor device having an automatic controlled delay circuit which is capable of detecting and adjusting a variation in delay with PVT (Process Voltage Temperature) variation, and a method therefor.

In accordance with a preferred embodiment of the present invention, there is provided to a semiconductor device having a delay circuit which delays a wordline activating signal by a predetermined time period to output the same as a bitline sense amplifier activating signal, wherein the delay circuit is implemented with a plurality of delay blocks that are connected serially, which comprises: means for generating a plurality of delayed pulse signals, each of which has different delay values at a time point at which the wordline activating signal is activated, through the use of an internal clock; means for detecting an activation time point of the bitline sense amplifier activating signal to generate a detected pulse signal; and means for comparing the plurality of delayed pulse signals with the detected pulse signal to control the plurality of delay blocks.

The semiconductor device of the present invention compares the bitline sense amplifier activating signal with the delayed pulse signals, when the wordline activating signal after the issuing of power-up signal, and detects how a delay value in the delay is changed from a desired delay value. Subsequently, the semiconductor device controls each unit delay block in the delay circuit, to thereby control an activation time point of the bitline sense amplifier activating signal.

Accordingly, although the delay circuit has one differed from a designed delay value due to the PVT variation, the present invention is capable of detecting a variation in delay with the PVT variation and adjusting the delay value of a delay circuit, to thereby obtain a desired delay value.

BRIEF DESCRIPTION OF DRAWINGS

The above and other objects and features of the present invention will become apparent from the following description of preferred embodiments given in conjunction with the accompanying drawings, in which.

DETAILED DESCRIPTION OF THE INVENTION

Hereinafter, a semiconductor memory device according to the present invention will be described in detail referring to the accompanying drawings.

Figure 1:
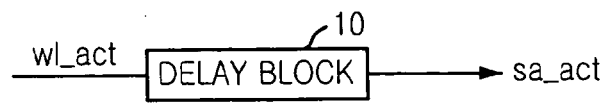
FIG. 1 is a block diagram illustrating a circuit of generating a sense amplifier activating signal according to the prior art.
Figure 2:
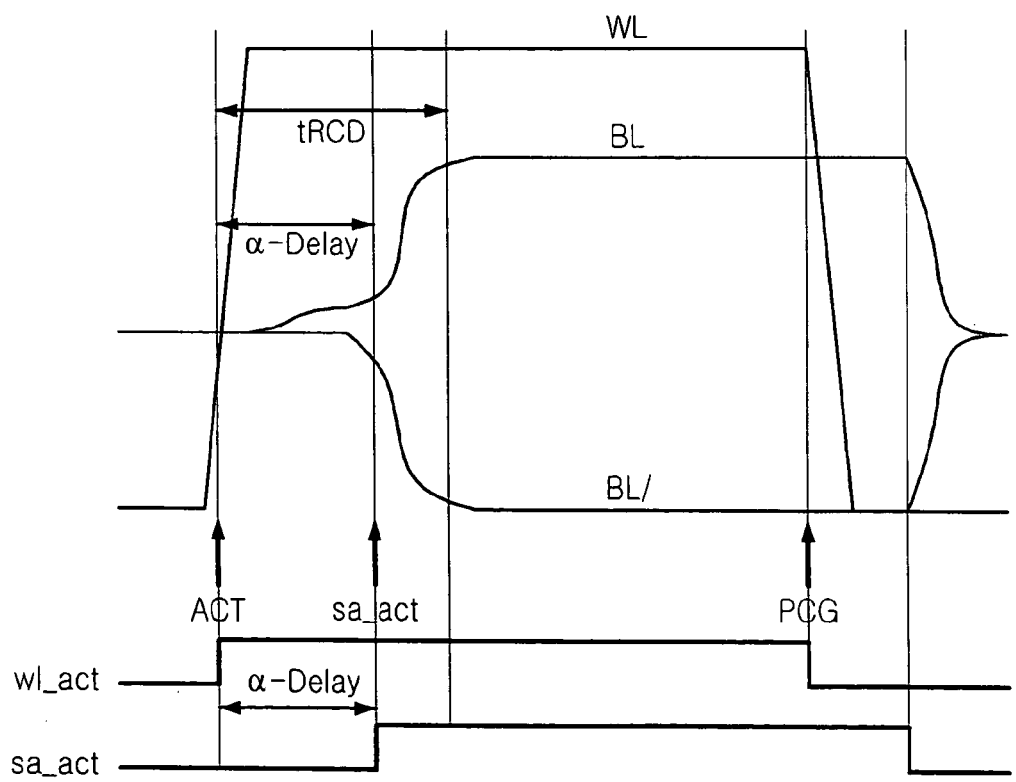
FIG. 2 is a waveform of the circuit shown in FIG. 1 and a diagram illustrating a variation in voltage of bitline and wordline with input signals.
Figure 3:
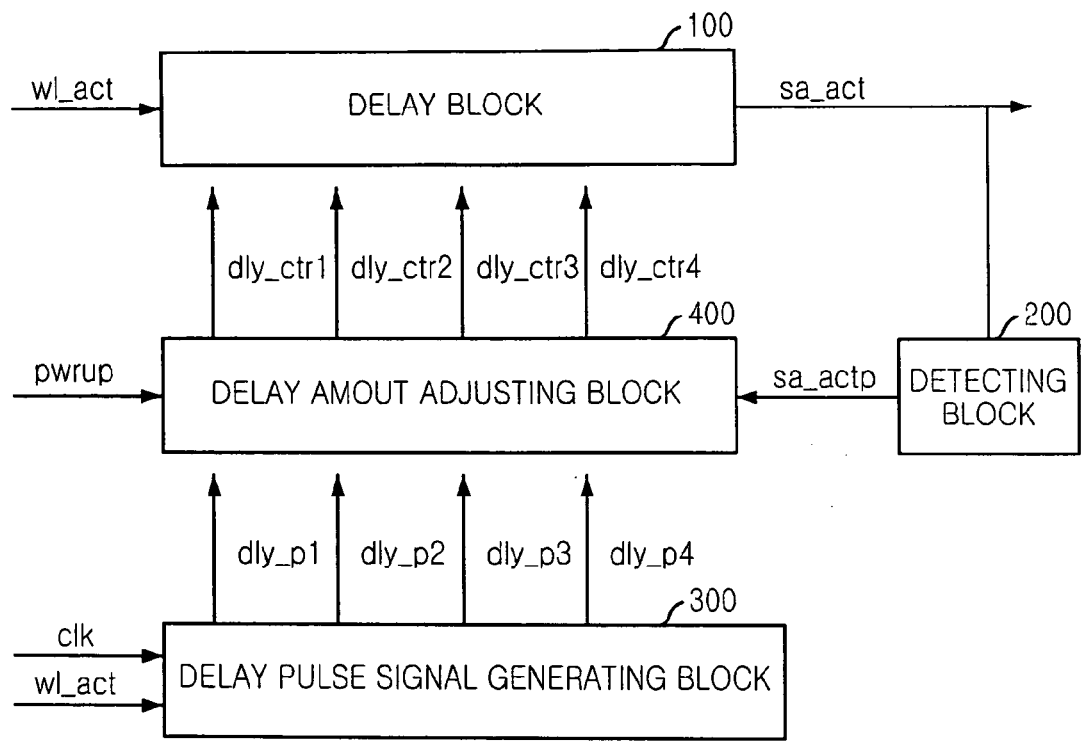
FIG. 3 is a schematic block diagram of a semiconductor device having an automatic controlled delay circuit in accordance with the present invention.

FIG. 3 is a schematic block diagram of a semiconductor device having an automatic controlled delay circuit in accordance with the present invention.

Referring to FIG. 3, the semiconductor device comprises: a delay block 100 for delaying a wordline activating signal wl_act by a predetermined time period; a delayed pulse signal generating block 300 for generating a reference pulse signal which is synchronous with an internal clock after the activation of the wordline activating signal wl_act, and delaying the same to generate a plurality of delayed pulse signals dly_p1, dly_p2, dly_p3, and dly_p4; a signal detecting block 200 for detecting an activation time point of a bitline sense amplifier activating signal sa_act to generate a detected pulse signal sa_actp; and a delay amount adjusting block 400 for comparing the plurality of delayed pulse signals dly_p1, dly_p2, dly_p3, and dly_p4 with the detected pulse signal sa_actp to thereby control the delay block 100.

A detailed description will be as to the operation. First, the wordline activating signal wl_act is activated responsive to the activation of the active command ACT. Subsequently, the delay block 100 activates the bitline sense amplifier activating signal sa_act delayed therein. The signal detecting block 200 detects the same to output the detected pulse signal sa_actp. Meanwhile, the delayed pulse signal generating block 300 generates the reference pulse signal ref_p and the delayed pulse signals dly_p1, dly_p2, dly_p3, and dly_p4 having consecutive delays based on the reference pulse signal ref_p, wherein the reference pulse signal ref_p has a desired activation time point of the bitline sense amplifier activating signal sa_act with reference to the internal clock clk after the activation of the wordline activating signal wl_act. Subsequently, the delay amount adjusting block 400 compares the detected pulse signal sa_actp with the delayed pulse signals dly_p1, dly_p2, dly_p3, and dly_p4, and adjusts a delay amount of the delay block 100 to control the activation time point of the bitline sense amplifier activating signal sa_act.

In the semiconductor device in accordance with the present invention, the desired activation time point of the bitline sense amplifier activating signal sa_act is determined based on the internal clock clk after the activation of the wordline activating signal wl_act, thereby generating the reference pulse signal ref_p with a fixed delay value, which is unaffected by the PVT variation. Through the delayed pulse signals dly_p1, dly_p2, dly_p3, and dly_p4 with the fixed delay value based on the reference pulse signal ref_p, the delay of the bitline sense amplifier activating signal sa_act is detected to adjust the delay amount of the delay block 100.

Figure 4:
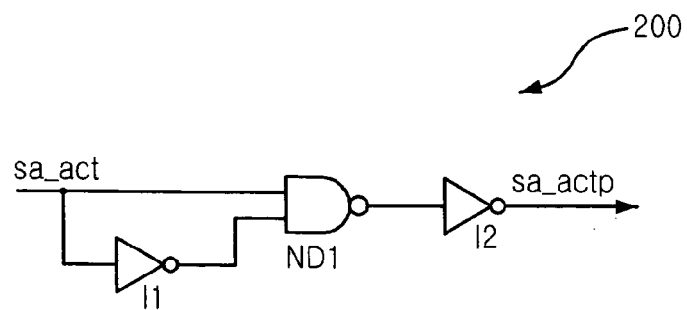
FIG. 4 is an internal circuit diagram of the signal detecting block shown in FIG. 3.

FIG. 4 is an internal circuit diagram of the signal detecting block 200 shown in FIG. 3.

Referring to FIG. 4, the signal detecting block 200 includes an inverter I1 for inverting the bitline sense amplifier activating signal sa_act, a NAND gate ND1 for receiving the output signal of the inverter I1 and the bitline sense amplifier activating signal sa_act as its input, and a NAND gate I2 for inverting the output signal of the NAND gate ND1 to output the detected pulse signal sa_actp.

The signal detecting block 200 detects a rising edge of the bitline sense amplifier activating signal sa_act to activate the detected pulse signal sa actp.

Figure 5:
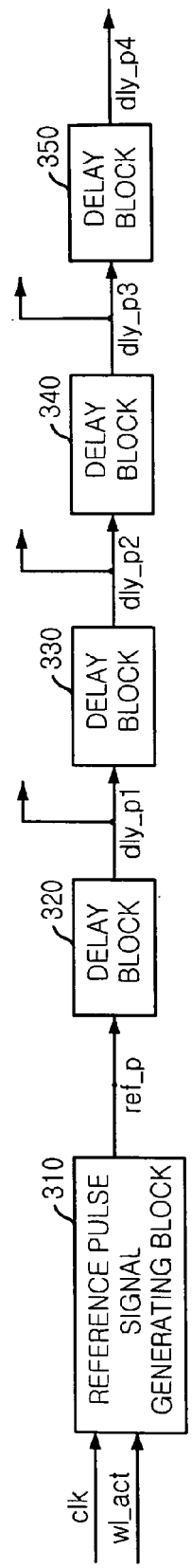
FIG. 5 is an internal circuit diagram of the delayed pulse signal generating block shown in FIG. 3.

FIG. 5 is an internal circuit diagram of the delayed pulse signal generating block 300 shown in FIG. 3.

Referring to FIG. 5, the delayed pulse signal generating block 300 includes a reference pulse signal generating block 310 for detecting the desired activation time point of the bitline sense amplifier activating signal sa_act based on the internal clock clk after the activation of the wordline activating signal wl_act, and generating the same as the reference pulse signal ref_p, and a plurality of delay blocks 320, 330, 340, and 350 for outputting the plurality of delayed pulse signals dly_p1, dly_p2, dly_p3, and dly_p4 having consecutive delays based on the reference pulse signal ref_p.

Note that, the delay amount of each of the delayed pulse signals dly_p1, dly_p2, dly_p3, and dly_p4 has the delay of integral multiples of 2 ns on the basis of the reference pulse signal ref_p, respectively.

Figure 6:
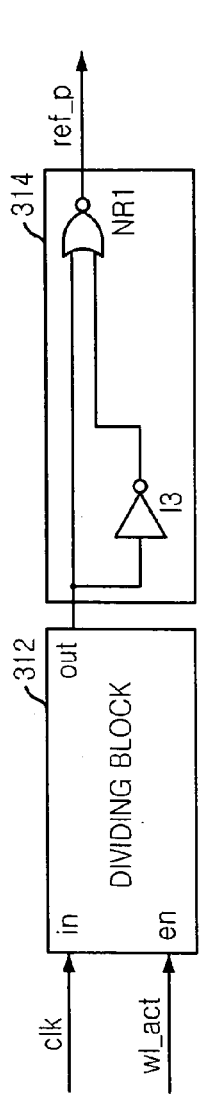
FIG. 6 is an internal circuit diagram of the reference pulse signal generating block shown in FIG. 5.

FIG. 6 is an internal circuit diagram of the reference pulse signal generating block 310 shown in FIG. 5.

Referring to FIG. 6, the reference pulse signal generating block 310 includes a dividing block 312 for dividing the internal clock clk through the use of the wordline activating signal wl_act as an enable signal EN, and a pulse generating block 314 for outputting the output signal of the dividing block 312 as a pulse type of the reference pulse signal ref_p.

The pulse generating block 314 includes an inverter I3 for inverting the output signal of the dividing block 312, and a NOR gate NR1 for receiving the output signals of the dividing block 312 and the inverter I3 as its inputs to output the reference pulse signal ref_p.

The reference pulse signal generating block 310 divides the internal clock clk after the activation of the wordline activating signal wl_act and detects a falling edge to generate the reference pulse signal ref_p. Such process is that the activation time point of the bitline sense amplifier activating signal sa_act is determined based on the internal clock clk. The internal circuit configuration of the reference pulse signal generating block 310 depends on a period of the internal clock clk and a desired delay value.

Therefore, the dividing block 312 may change the division number for the internal clock clk, and the pulse generating block 314 may generate pulse signals responsive to the rising edge and the falling edge.

Figure 7:
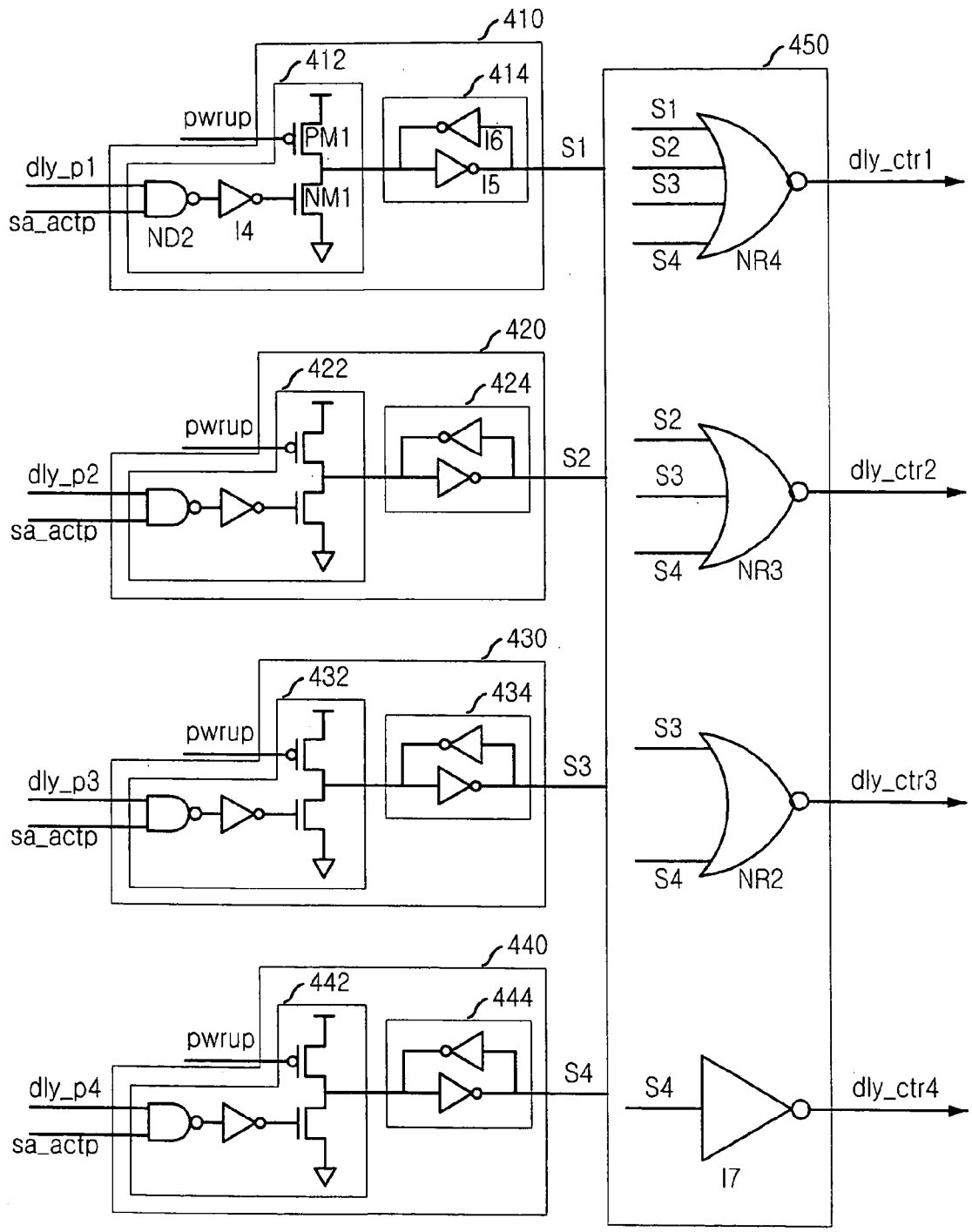
FIG. 7 is an internal circuit diagram of the delay amount adjusting block shown in FIG. 3.

FIG. 7 is an internal circuit diagram of the delay amount adjusting block 400 shown in FIG. 3.

Referring to FIG. 7, the delay amount adjusting block 400 includes: a plurality of delay amount detecting blocks 410, 420, 430, and 440 for comparing the detected pulse signal sa_actp with each of the plurality of delayed pulse signals dly_p1, dly_p2, dly_p3, and dly_p4 to produce a plurality of delay amount detection signals s1, s2, s3, and s4; and a delay amount adjustment signal generating block 450 for combining the plurality of delay amount detection signals s1, s2, s3, and s4 to produce a plurality of delay amount adjustment signals dly_ctr1, dly_ctr2, dly_ctr3, and dly_ctr4, which controls each unit delay block 120, 130, 140, and 150 constituting the delay block 100.

Each of the plurality of delay amount detecting blocks 410, 420, 430, and 440 includes: signal generating blocks 412, 422, 432, and 442 for respectively comparing the detected pulse signal sa_actp with the delay amount detection signals s1, s2, s3, and s4 after the activation of the power-up signal pwrup, to produce the delay amount detection signals s1, s2, s3, and s4 respectively; and latching blocks 414, 424, 434, and 444 for latching the output signal of each of the signal generating blocks 412, 422, 432, and 442 and outputting the same, respectively.

Each of the signal generating blocks 412, 422, 432, and 442 is implemented with the same elements, only illustrative one will be depicted for the sake of simplicity.

The signal generating block 412 includes: a NAND gate ND2 with the detected pulse signal sa_actp and the delayed pulse signal dly_p1 as its gate inputs; an inverter I4 for inverting the output signal of the NAND gate ND2; a PMOS transistor PM1 with the power-up signal pwrup as its gate input; and a NMOS transistor NM1 with the output signal of the inverter I4 as its gate input, wherein the delay amount detection signal s1 is outputted at a connection node between the PMOS transistor PM1 and the NMOS transistor NM1 which are connected in series between the power supply voltage and the ground.

Each of the plurality of delay amount detecting blocks 410, 420, 430, and 440 receives a corresponding one of the delayed pulse signals dly_p1, dly_p2, dly_p3, and dly_p4 and the detected pulse signal sa_actp, and detects whether both of received input signals are activated, to thereby activates the delay amount detection signals s1, s2, s3, and s4, respectively. Herein, since each of the delayed pulse signals dly_p1, dly_p2, dly_p3, and dly_p4 has a fixed delay value based on the reference pulse signal ref_p, when the detected pulse signal sa_actp is activated with a particular delayed pulse signal, the delay amount of the delayed pulse signal becomes that of the bitline sense amplifier activating signal sa_act.

Note that, when the wordline activating signal wl_act is firstly activated after the activation of the power-up signal pwrup, all of the delay amount detection signals s1, s2, s3, and s4 are inactivated.

The delay amount adjustment signal generating block 450 includes: an inverter I7 for inverting the delay amount detection signal s4 to produce the delay amount adjustment signal dly_ctr4; a NOR gate NR2 for receiving the delay amount detection signal s4 and the delay amount detection signal S3 as its inputs to output the delay amount adjustment signal dly_ctr3; a NOR gate NR3 for receiving the delay amount detection signal s4, the delay amount detection signal S3 and the delay amount detection signal S2 as its inputs to output the delay amount adjustment signal dly_ctr2; and a NOR gate NR4 for receiving the delay amount detection signal s4, the delay amount detection signal S3, the delay amount detection signal S2 and the delay amount detection signal S1 as its inputs to output the delay amount adjustment signal dly_ctr1.

Note that, since each of the delay amount adjustment signals dly_ctr1, dly_ctr2, dly_ctr3, and dly_ctr4 controls a corresponding one of the unit delay blocks 120, 130, 140, and 150 with the delay value of 2 ns, the delay amount adjustment signal generating block 450 changes the number of the delay amount adjustment signals dly_ctr1, dly_ctr2, dly_ctr3, and dly_ctr4, which are activated according to the delay of the delay amount detection signals s1, s2, s3, and s4.

Figure 8:
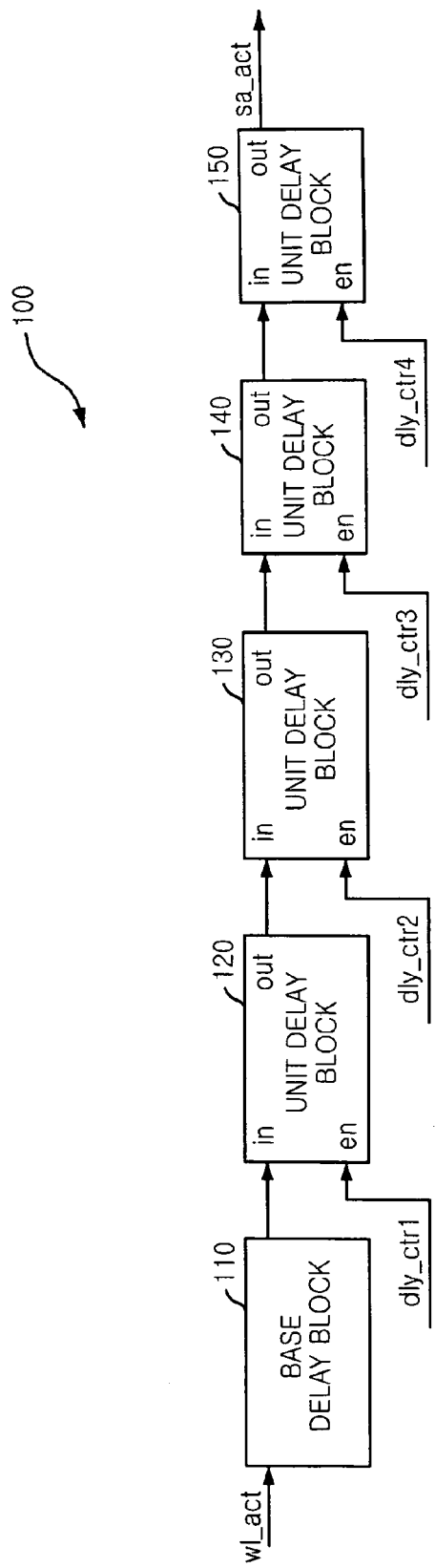
FIG. 8 is am internal circuit diagram of the delay block shown in FIG. 3.

FIG. 8 is am internal circuit diagram of the delay block 100 shown in FIG. 3.

Referring to FIG. 8, the delay block 100 includes: a base delay block 110 for applying a basic delay to an input signal after the activation of the wordline activating signal wl_act to output a delayed signal; and a plurality of unit delay blocks 120, 130, 140, and 150 for delaying the output signal of the base delay block 110 to output the same as the bitline sense amplifier activating signal sa_act. In this case, each of the unit delay blocks 120, 130, 140, and 150 controls its corresponding delay responsive to the plurality of delay amount adjustment signals dly_ctr1, dly_ctr2, dly_ctr3, and dly_ctr4. In design, the overall delay value that undergone the base delay block 110 and the plurality of unit delay blocks 120, 130, 140, and 150 is $\alpha$-delay. Each of the unit delay blocks 120, 130, 140, and 150 is design to have the delay value of 2 ns. The reason for this is that the design allows each of the delayed pulse signals dly_p1, dly_p2, dly_p3, and dly_p4 to be created every 2 ns.

Note that, each of the unit delay blocks 120, 130, 140, and 150 is implemented with one that is slightly affected by the PVT variation compared to the base delay block.

Figure 9:
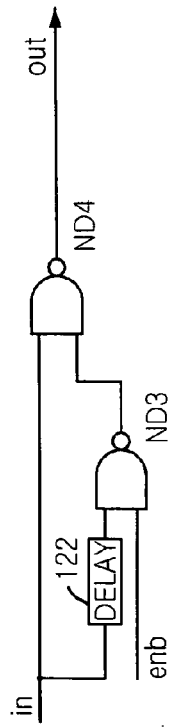
FIG. 9 is an internal circuit diagram of the unit delay block shown in FIG. 8.

FIG. 9 is an internal circuit diagram of the unit delay block 120 shown in FIG. 8. The circuit configuration of each of the unit delay blocks 130, 140, and 150 is equal to that of the unit delay block 120.

Referring to FIG. 9, the unit delay block 120 includes: a delay block 122 for applying the additional delay to the input signal IN for output thereof; a NAND gate ND3 with the output signal of the delay block 122 and a delay amount adjustment signal EN as its inputs; and a NAND gate ND4 with the input signal IN and the output signal of the NAND gate ND3 as its inputs.

Each of the unit delay blocks 120, 130, 140, and 150 passes the input signal through the delay block 122 in response to the activation of each of the delay amount adjustment signals dly_ctr1, dly_ctr2, dly_ctr3, and dly_ctr4, thereby allowing the input signal to have the additional delay thereby. Alternatively, each of the unit delay blocks 120, 130, 140, and 150 allows the input signal to have the delay in the NAND gate ND4 only in response to the inactivation of each of the delay amount adjustment signals dly_ctr1, dly_ctr2, dly_ctr3.

Figure 10:
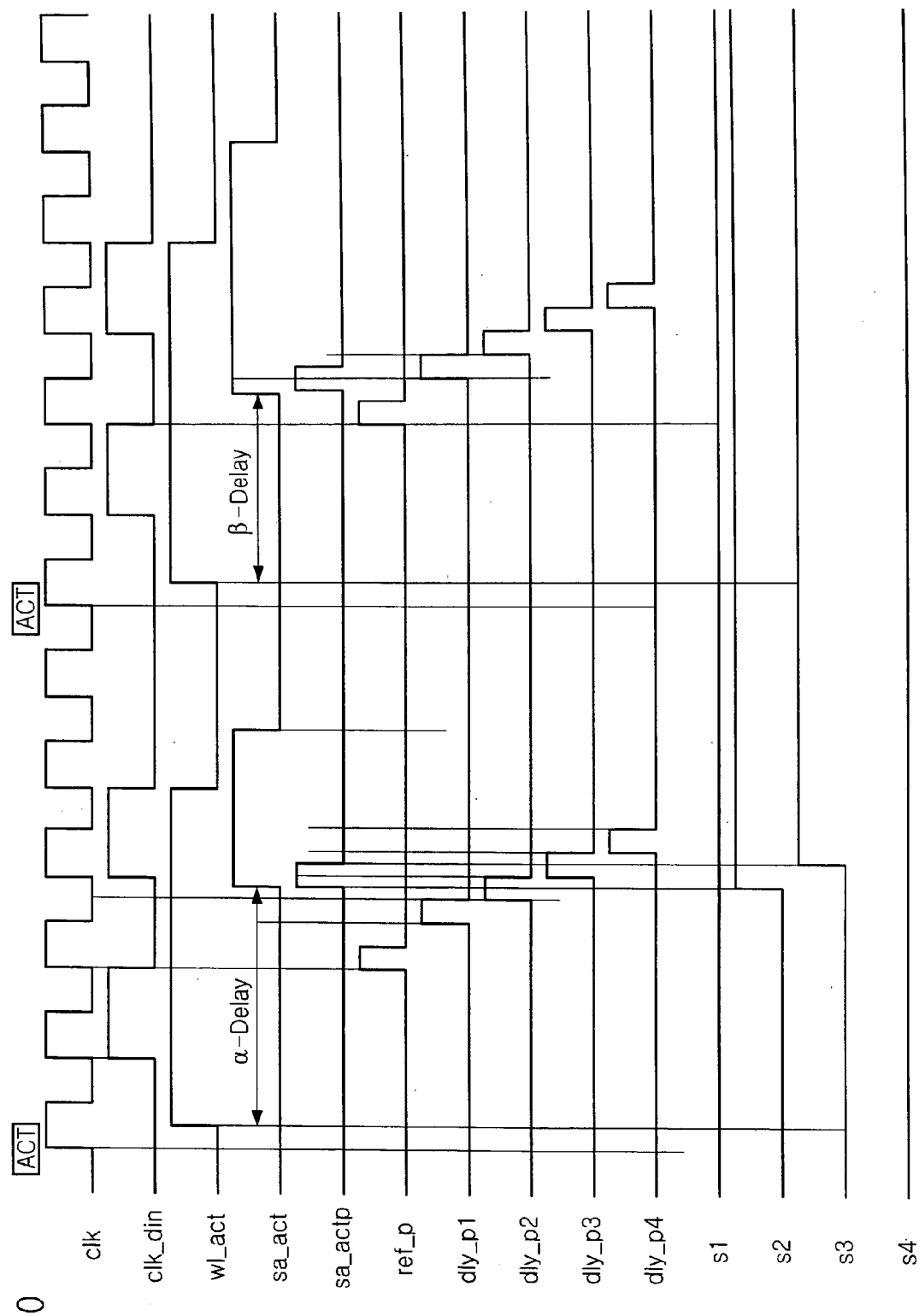
FIG. 10 is an operation waveform of the circuit shown in FIG. 3.

FIG. 10 is an operation waveform of the circuit shown in FIG. 3.

Referring to FIG. 10, the wordline activating signal wl_act is activated based on the issuing of the active command ACT. In response to the activation, the bitline sense amplifier activating signal sa_act is activated from the delay block 100 after the predetermined time period $\alpha$-Delay for output thereof. In this case, the $\alpha$-Delay has at least a delay time period (7–8 ns) that is firstly designed by the PVT variation. Meanwhile, the reference pulse signal ref_p is created at a desired time point after the activation of the wordline activating signal wl_act, and the delayed pulse signals dly_p1, dly_p2, dly_p3, and dly_p4 each of which having the delay of integral multiples of 2 ns are created based on the reference pulse signal ref_p created so. The activation of the delayed pulse signals dly_p1, dly_p2, dly_p3, and dly_p4, and the bitline sense amplifier activating signal sa_act is performed by the compared delay amount detection signals s1, s2, s3, and s4. The delay amount detection signals s1, s2, s3, and s4 control the unit delay blocks 120, 130, 140, and 150 in the delay block 100, thereby allowing the bitline sense amplifier activating signal sa_act to have a delay value $\beta$-Delay, which will be adjusted later.

Specifically, the wordline activating signal wl_act is activated by the issuing of a second active command ACT, and the bitline sense amplifier activating signal sa_act is activated after the predetermined time period β-Delay in response to the activation.

The predetermined time period β-Delay, which undergone all delay in the delay block 100 at an initial operation after the power-up, is that is advanced under the control of the delay amount adjustment signals dly_ctr1, dly_ctr2, dly_ctr3. Specifically, after the initial operation the bitline sense amplifier activating signal sa_act is activated with the β-Delay that is controlled after the activation of the wordline activating signal wl_act.

Figure 11:
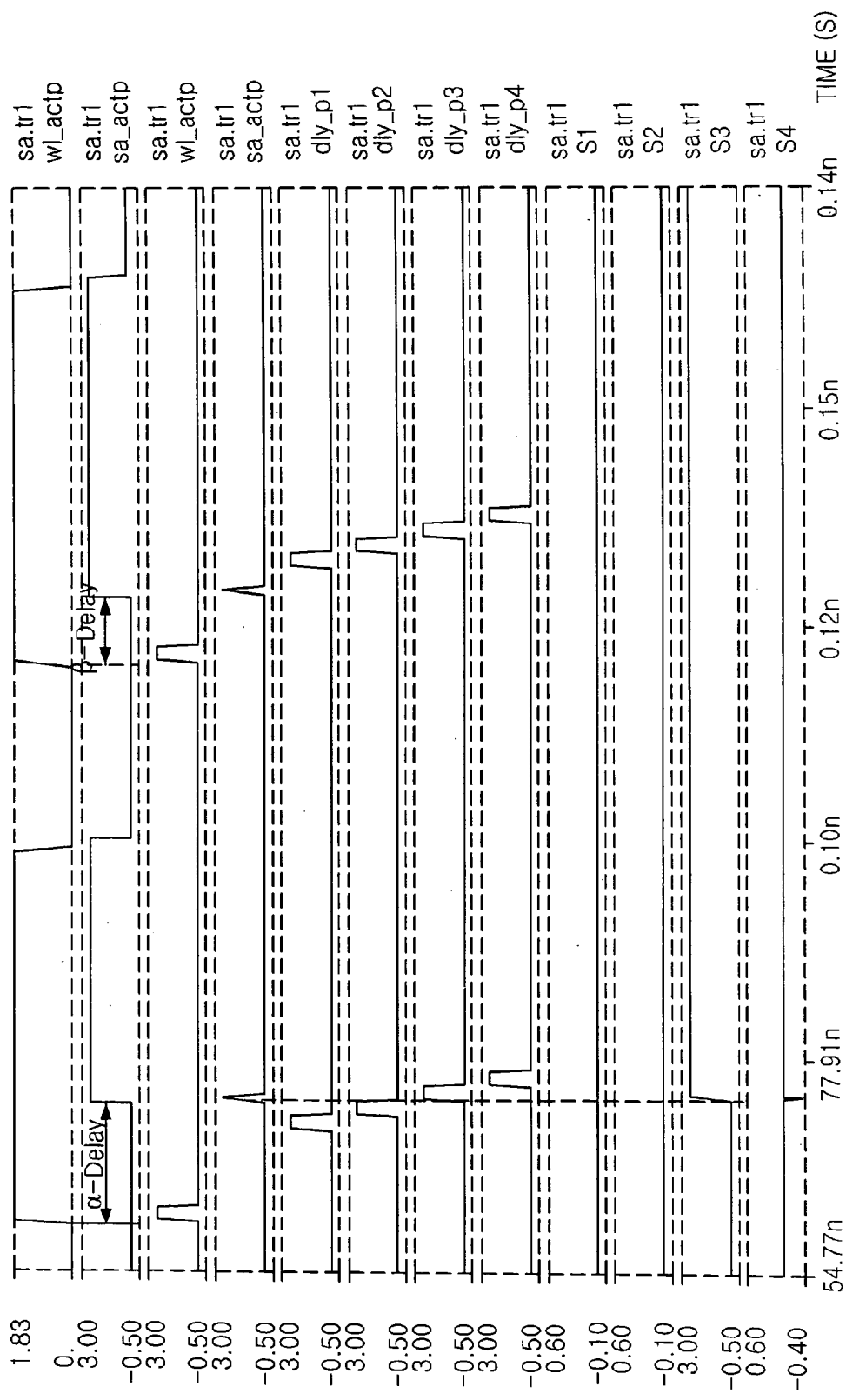
FIG. 11 is a diagram illustrating simulation results for the circuit shown in FIG. 3.

FIG. 11 is a diagram illustrating simulation results for the circuit shown in FIG. 3.

Compared FIG. 11 with FIG. 10, it will appreciate that although the bitline sense amplifier activating signal sa_act, which is activated by the wordline activating signal wl_act firstly activated after the activation of the power-up signal pwrup, is activated with α-Delay of 17 ns, subsequent adjustments of delay allows the bitline sense amplifier activating signal sa_act to be activated with β-Delay of 8 ns.

Note that, the pulse width of the delayed pulse signals dly_p1, dly_p2, dly_p3, and dly_p4 is 2 ns.

The semiconductor device of the present invention specifies a desired activation time point of the bitline sense amplifier activating signal sa_act through the internal clock from a time point after the activation of the wordline activating signal wl_act, and generates delayed pulse signals having consecutive delays based on the specified time point, thereby allowing the delay amount of the delay circuit. As a result, the present invention detects a variation in delay with the PVT variation to compensate the delay variation detected so, through the processes of detecting and adjusting the delay degree of the bitline sense amplifier activating signal.

Specifically, the present invention allows the bitline sense amplifier activating signal to be activated at a desired time point without additional delays by the PVT variation, thereby improving the operating frequency and bin portion of the semiconductor device.

In the aforementioned embodiment, while the present invention has been described for a delay circuit, which outputs a bitline sense amplifier activating signal with a predetermined delay after the activation of a wordline activating signal, but it not limited thereto, it can be extended to one, which delays input signals by a predetermined time period for output thereof.

Further, while the present invention has been described that the delay amount of the delayed pulse signals is 2 ns or integral multiples thereof, it is not limited thereto.

As previously mentioned, although the delay circuit has one differed from a designed delay value due to PVT variation, the present invention is capable of detecting a variation in delay with the PVT variation and adjusting the delay value of a delay circuit, to thereby obtain a desired delay value.

The present application contains subject matter related to Korean patent applications No. 2003-86251, filed in the Korean Patent Office on Dec. 1, 2003, the entire contents of which being incorporated herein by reference.

While the present invention has been described with respect to the particular embodiments, it will be apparent to those skilled in the art that various changes and modification may be made without departing from the spirit and scope of the invention as defined in the following claims.

What is claimed is:

1. A semiconductor device having a delay circuit which delays a wordline activating signal by a predetermined time period to output the same as a bitline sense amplifier activating signal, wherein the delay circuit is implemented with a plurality of delay blocks that are connected serially, which comprises:
   means for generating a plurality of delayed pulse signals, each of which has different delay values at a time point at which the wordline activating signal is activated, through the use of an internal clock;
   means for detecting an activation time point of the bitline sense amplifier activating signal to generate a detected pulse signal; and
   means for comparing the plurality of delayed pulse signals with the detected pulse signal to control the plurality of delay blocks.

2. The semiconductor device of claim 1, wherein the delayed pulse signal generating means includes:
   means for generating a reference pulse signal which is synchronous with the internal clock after a desired delay time of the delay circuit from the activation time point of the wordline activating signal, in response to the internal clock and the wordline activating signal; and
   a plurality of delay members for outputting the plurality of delayed pulse signals each of which having consecutive fixed delay amounts based on the reference pulse signal.

3. The semiconductor device of claim 2, wherein the reference pulse signal generating means includes:
   a dividing member for dividing the internal clock through the use of the wordline activating signal as an enable signal; and
   a pulse generating member for detecting a rising edge or a falling edge on the output signal of the dividing block, and outputting the same as a pulse type of the reference pulse signal.

4. The semiconductor device of claim 3, wherein the pulse generating member includes:
   an inverter for inverting the output signal of the dividing member; and
   a NOR gate for receiving the output signals of the dividing member and the inverter as its inputs to output the reference pulse signal.

5. The semiconductor device of claims 2, wherein the comparing means includes:
   a plurality of delay amount detecting members for comparing the detected pulse signal with the plurality of delayed pulse signals to thereby produce a plurality of delay amount detection signals; and
   a delay amount adjustment signal generating member for combining the plurality of delay amount detection signals to thereby produce a plurality of delay amount adjustment signals for adjusting the delay amounts of the plurality of unit delay blocks.

6. The semiconductor device of claim 5, wherein each of the plurality of delay amount detecting members includes:
   a signal generating member for comparing the plurality of detected pulse signals with the delay amount detection signals after the activation of the power-up signal, to thereby generate the delay amount detection signals; and
   a latching member for latching the output signals of the signal generating member.

7. The semiconductor device of claim 6, wherein the signal generating member includes:
   a NAND gate with the detected pulse signal and a first delayed pulse signal as its gate inputs;
   an inverter for inverting the output signal of the NAND gate;
   a PMOS transistor with the power-up signal as its gate input; and a NMOS transistor with the output signal of the inverter as its gate input, wherein the delay amount detection signals are outputted at a connection node between the PMOS transistor and the NMOS transistor which are connected in series between the power supply voltage and the ground.

8. The semiconductor device of claim 7, wherein the delay amount adjustment signal generating member includes:

an inverter for inverting a first delay amount detection signal to produce a first delay amount adjustment signal;

a first NOR gate for receiving the first delay amount detection signal and a second delay amount detection signal as its inputs to output a second delay amount adjustment signal;

a second NOR gate for receiving the first delay amount detection signal, the second delay amount detection signal and a third delay amount detection signal as its inputs to output a third delay amount adjustment signal; and a third NOR gate for receiving the first delay amount detection signal, the second delay amount detection signal, the third delay amount detection signal and a fourth delay amount detection signal as its inputs, to thereby output a fourth delay amount adjustment signal.

9. The semiconductor device of claim 5, wherein the detecting means includes:

an inverter for inverting the bitline sense amplifier activating signal;

a NAND gate for receiving the output signal of the inverter and the bitline sense amplifier activating signal as its inputs, to thereby output the detected pulse signal.

10. The semiconductor device of claims 2, wherein the plurality of delay blocks includes:

a base delay block for applying a basic delay to an input signal after the activation of the wordline activating signal to output a delayed signal; and a plurality of unit delay blocks for delaying the output signal of the base delay block to output the same as the bitline sense amplifier activating signal, wherein each of the unit delay blocks controls the delay responsive to the plurality of delay amount adjustment signals.

11. The semiconductor device of claim 10, wherein the plurality of unit delay blocks allows the input signal to be undergone delay of only one inverter in response to the plurality of delay amount adjustment signals, or allow the input signal to have the additional delay, for output thereof.

12. The semiconductor device of claim 11, wherein the plurality of unit delay blocks includes:

a delay member for applying the additional delay to the input signal for output thereof;

a first NAND gate with the output signal of the delay member and the delay amount adjustment signal as its inputs; and a second NAND gate with the input signal and the output signal of the first NAND gate as its inputs.

13. A method for driving a semiconductor device, which comprises the steps of:

delaying a wordline activating signal in a delay circuit to output the same as a bitline sense amplifier activating signal;

generating a plurality of delayed pulse signals, wherein the plurality of delayed pulse signals is generated by delaying a reference pulse signal having a delay value of the delay circuit, which is designed at a time point at which the wordline activating signal is activated, through the use of an internal clock;

detecting an activation time point of the bitline sense amplifier activating signal to generate a detected pulse signal; and comparing the plurality of delayed pulse signals with the detected pulse signal to adjust the delay amount of the delay circuit.

14. A semiconductor device having a delay circuit which outputs a first signal as a second signal after a predetermined time period, wherein the delay circuit is implemented with a plurality of unit delay blocks that are connected serially, which comprises:

means for generating a plurality of delayed pulse signals, each of which has different delay values at a time point at which the first signal is activated, through the use of an internal clock;

means for detecting an activation time point of the second signal to generate a detected pulse signal; and means for comparing the plurality of delayed pulse signals with the detected pulse signal to adjust the plurality of unit delay blocks.

15. The semiconductor device of claim 14, wherein the delay circuit includes:

a base delay block for applying a basic delay to an input signal after the activation of the first signal to thereby output a delayed signal; and a plurality of unit delay blocks for delaying the output signal of the base delay block to output the same as the second signal, wherein each of the unit delay blocks controls the delay under the control of the comparing means.

16. The semiconductor device of claims 14 or 15, wherein the delayed pulse signal generating means includes:

means for generating a reference pulse signal which is synchronous with the internal clock after a desired delay time of the delay circuit from the activation time point of the first signal, in response to the internal clock and the first signal; and a plurality of delay members for outputting the plurality of delayed pulse signals each of which having consecutive fixed delays based on the reference pulse signal.

17. The semiconductor device of claims 14 or 15, wherein the comparing means includes:

a plurality of delay amount detecting members for comparing the detected pulse signal with the plurality of delayed pulse signals to produce a plurality of delay amount detection signals; and a delay amount adjustment signal generating member for combining the plurality of delay amount detection signals to produce a plurality of delay amount adjustment signals for adjusting the delay amounts of the plurality of unit delay blocks.

18. A method for driving a semiconductor device, which comprises the steps of:

delaying a first signal in a delay circuit to output the same as a second signal;

generating a plurality of delayed pulse signals, wherein the plurality of delayed pulse signals is generated by delaying a reference pulse signal having a delay value of the delay circuit, which is designed at a time point at which the first signal is activated, through the use of an internal clock;

detecting an activation time point of the second signal to generate a detected pulse signal; and comparing the plurality of delayed pulse signals with the detected pulse signal to control the delay amount of the second signal.

* * * * *